(12) United States Patent
Lee

(10) Patent No.: US 9,837,134 B2
(45) Date of Patent: Dec. 5, 2017

(54) SEMICONDUCTOR DEVICE AND SYSTEM INCLUDING SENSE AMPLIFIER AND PRE-CHARGE VOLTAGE BY A VARIATION

(71) Applicant: SK hynix Inc., Icheon-si Gyeonggi-do (KR)

(72) Inventor: Woo Young Lee, Icheon-si Gyeonggi-do (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 14/947,845

(22) Filed: Nov. 20, 2015

(65) Prior Publication Data

US 2017/0032830 A1 Feb. 2, 2017

(30) Foreign Application Priority Data

Jul. 27, 2015 (KR) .................. 10-2015-0106092

(51) Int. Cl.
| | |
|---|---|
| *G11C 7/12* | (2006.01) |
| *G11C 11/4074* | (2006.01) |
| *G11C 7/06* | (2006.01) |
| *G11C 7/08* | (2006.01) |
| *G11C 11/4091* | (2006.01) |
| *G11C 11/4094* | (2006.01) |

(52) U.S. Cl.
CPC .............. *G11C 7/12* (2013.01); *G11C 7/06* (2013.01); *G11C 7/08* (2013.01); *G11C 11/4074* (2013.01); *G11C 11/4091* (2013.01); *G11C 11/4094* (2013.01)

(58) Field of Classification Search
CPC .... G11C 7/12; G11C 7/06; G11C 7/08; G11C 11/4074; G11C 11/4091; G11C 11/4094

USPC .................................... 365/203, 205
See application file for complete search history.

(56) References Cited

U.S. PATENT DOCUMENTS

| | | | | | |
|---|---|---|---|---|---|
| 5,625,597 | A * | 4/1997 | Hirose | ............... | G11C 29/02 365/201 |
| 5,646,900 | A * | 7/1997 | Tsukude | ............. | G11O 5/146 365/189.09 |
| 6,292,418 | B1 * | 9/2001 | Kawashima | .......... | G11C 11/419 365/203 |
| 6,433,590 | B1 * | 8/2002 | Lee | .................... | G11C 7/062 327/51 |
| 7,729,184 | B2 * | 6/2010 | Im | ...................... | G11C 7/065 365/201 |

(Continued)

FOREIGN PATENT DOCUMENTS

KR    1020110001784 A    1/2011

*Primary Examiner* — Vu Le
*Assistant Examiner* — Sung Cho
(74) *Attorney, Agent, or Firm* — William Park & Associates Ltd.

(57) ABSTRACT

A semiconductor system includes a first semiconductor device and a second semiconductor device. The first semiconductor device outputs an external command. The second semiconductor device provides a first supply voltage to a bit line sense amplifier. The first supply voltage is generated by using a precharge voltage in response to the external command during a first time period from a point in time when a precharge mode begins. The second semiconductor device also adjusts a voltage level of the first supply voltage during a second time period from a point in time when the first time period terminates to a point in time when an active mode begins.

20 Claims, 13 Drawing Sheets

(56) References Cited

U.S. PATENT DOCUMENTS

| | | | | |
|---|---|---|---|---|
| 8,675,433 B2* | 3/2014 | Katoch | G11C 7/08 | 365/205 |
| 2001/0003508 A1* | 6/2001 | Lee | G11C 7/14 | 365/185.02 |
| 2003/0058722 A1* | 3/2003 | Park | G11C 7/06 | 365/205 |
| 2004/0042305 A1* | 3/2004 | Joo | G11C 7/06 | 365/205 |
| 2004/0136252 A1* | 7/2004 | Ueda | G11C 7/065 | 365/205 |
| 2005/0264322 A1* | 12/2005 | Nakazato | G11C 7/065 | 327/51 |
| 2007/0096191 A1* | 5/2007 | Lee | G11C 11/4091 | 257/309 |
| 2007/0195624 A1* | 8/2007 | Song | G11C 7/065 | 365/205 |
| 2007/0201290 A1* | 8/2007 | Kang | G11C 7/065 | 365/205 |
| 2008/0008018 A1* | 1/2008 | Choi | G11C 7/02 | 365/205 |
| 2008/0225616 A1* | 9/2008 | Cheng | G11C 11/406 | 365/203 |
| 2009/0147604 A1* | 6/2009 | Kang | G11C 11/4091 | 365/205 |
| 2010/0172187 A1* | 7/2010 | Dunga | G11C 16/26 | 365/185.21 |
| 2011/0038220 A1* | 2/2011 | Won | G11C 11/4074 | 365/207 |
| 2011/0305098 A1* | 12/2011 | Choi | G11C 11/406 | 365/203 |
| 2012/0188836 A1* | 7/2012 | Lee | G11C 11/4094 | 365/203 |
| 2013/0080826 A1* | 3/2013 | Kondo | G11C 7/1006 | 714/6.2 |
| 2014/0085992 A1 | 3/2014 | Thompson et al. | | |
| 2015/0016183 A1* | 1/2015 | Sinangil | G11C 7/065 | 365/156 |
| 2015/0063007 A1* | 3/2015 | Choi | G11C 11/419 | 365/154 |
| 2016/0012868 A1* | 1/2016 | Moon | G11C 7/065 | 365/189.11 |

\* cited by examiner

SEMICONDUCTOR DEVICE AND SYSTEM INCLUDING SENSE AMPLIFIER AND PRE-CHARGE VOLTAGE BY A VARIATION

CROSS-REFERENCE TO RELATED APPLICATIONS

The present application claims priority under 35 U.S.C. 119(a) to Korean Patent Application No. 10-2015-0106092 filed on Jul. 27, 2015, in the Korean Intellectual Property Office, which is incorporated herein by reference in its entirety.

BACKGROUND

1. Technical Field

Embodiments of the present disclosure generally relate to an integrated circuit, and more particularly to a semiconductor device having a sense amplifier circuit and a semiconductor system including the semiconductor device.

2. Related Art

With advances in integrated circuit technology, a data storage capacity of semiconductor memory devices has been rapidly increasing, and technologies for manufacturing low-power, high-performance semiconductor memory devices have been making rapid progress. Moreover, the recent developments of portable electronic systems such as mobile phones or laptop computers are leading to demands for low-power, high-performance semiconductor memory devices.

The technologies for low-power semiconductor memory devices involve the power consumption management of core areas in semiconductor memory devices. The core area including memory cells, bit lines, and word lines may be designed in accordance with a minimum design rule for feature size, and thus scaled-down transistors with lower operation voltages may constitute the memory cells.

The technologies for high-performance semiconductor memory devices involve running the core areas at high speed. For instance, a bit-line precharge is one of the most important issues to increase the core operation speed such as an access time for data stored in the memory cells of the semiconductor memory devices to reach output pads of the semiconductor memory devices. The bit-line precharge is used to enhance an access time of cell data, which is logic high or logic low, by precharging the bit-lines with a predetermined voltage (e.g., half core voltage) before accessing the cell data.

SUMMARY

Various embodiments are directed to semiconductor devices and semiconductor systems including the semiconductor devices.

According to an embodiment, a semiconductor system includes a first semiconductor device and a second semiconductor device. The first semiconductor device outputs an external command. The second semiconductor device drives a first supply voltage, which is supplied to a bit line sense amplifier, to a precharge voltage in response to the external command during a first time period from a point of time that a precharge mode begins. The second semiconductor device also adjusts a level of the first supply voltage during a second time period from a point of time that the first time period terminates till a point of time that an active mode begins.

The second semiconductor device includes a pre-pull-up control signal generation unit suitable for generating a first pre-pull-up control signal which is enabled during the first time period and a second pre-pull-up control signal which is enabled during the second time period and a first supply voltage drive unit suitable for driving the first supply voltage to the precharge voltage in response to the first pre-pull-up control signal and suitable for driving the first supply voltage to a first set voltage in response to the second pre-pull-up control signal.

The first set voltage is lower than the precharge voltage by a variation voltage.

The variation voltage is set to a difference between threshold voltages of MOS transistors included in the bit line sense amplifier.

The second semiconductor device further includes a pre-pull-down control signal generation unit suitable for generating a pre-pull-down control signal which is enabled during the first time period and a second supply voltage drive unit suitable for driving a second supply voltage to the precharge voltage in response to the pre-pull-down control signal and suitable for stopping drive of the second supply voltage during the second time period.

The bit line sense amplifier receives the first supply voltage driven to a core voltage and the second supply voltage driven to a ground voltage to sense and amplify a voltage difference between a bit line and a complementary bit line, in the active mode.

According to another embodiment, a semiconductor device includes a pre-pull-down control signal generation unit and a first supply voltage drive unit. The pre-pull-down control signal generation unit generates a first pre-pull-down control signal which is enabled during a first time period from a point of time that a precharge signal is enabled. The pre-pull-down control signal generation unit also generates a second pre-pull-down control signal which is enabled during a second time period from a point of time that the first time period is terminated till a point of time that an active signal is enabled. The first supply voltage drive unit drives a first supply voltage to the precharge voltage in response to the first pre-pull-down control signal and drives the first supply voltage to a first set voltage in response to the second pre-pull-down control signal. The first supply voltage is supplied to a bit line sense amplifier.

According to yet another embodiment, a semiconductor device includes a first supply voltage generation unit and a second supply voltage generation unit. The first supply voltage generation unit drives a first supply voltage, which is supplied to a bit line sense amplifier, to a precharge voltage during a first time period from a point of time that a precharge signal is enabled. In addition, the first supply voltage generation unit adjusts a level of the first supply voltage during a second time period from a point of time that the first time period is terminated till a point of time that an active signal is enabled. The second supply voltage generation unit drives a second supply voltage, which is supplied to the bit line sense amplifier, to the precharge voltage during the first time period. The second supply voltage generation unit also stops drive of the second supply voltage during the second time period.

The first supply voltage generation unit includes a pre-pull-up control signal generation unit suitable for generating a first pre-pull-up control signal which is enabled during the first time period and a second pre-pull-up control signal which is enabled during the second time period and a first supply voltage drive unit suitable for driving the first supply voltage to the precharge voltage in response to the first pre-pull-up control signal and suitable for driving the first supply voltage to a set voltage in response to the second pre-pull-up control signal.

The set voltage is lower than the precharge voltage by a variation voltage.

The variation voltage is set to a difference between threshold voltages of MOS transistors included in the bit line sense amplifier.

The semiconductor device includes a sense amplifier circuit. The sense amplifier circuit includes the bit line sense amplifier. The sense amplifier circuit is suitable for precharging a bit line and a complementary bit line which are coupled to the bit line sense amplifier with the precharge voltage during the first time period and is suitable for receiving the first supply voltage whose level is adjusted during the second time period to adjust a level of the bit line or the complementary bit line according to a threshold voltage difference between MOS transistors included in the bit line sense amplifier.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
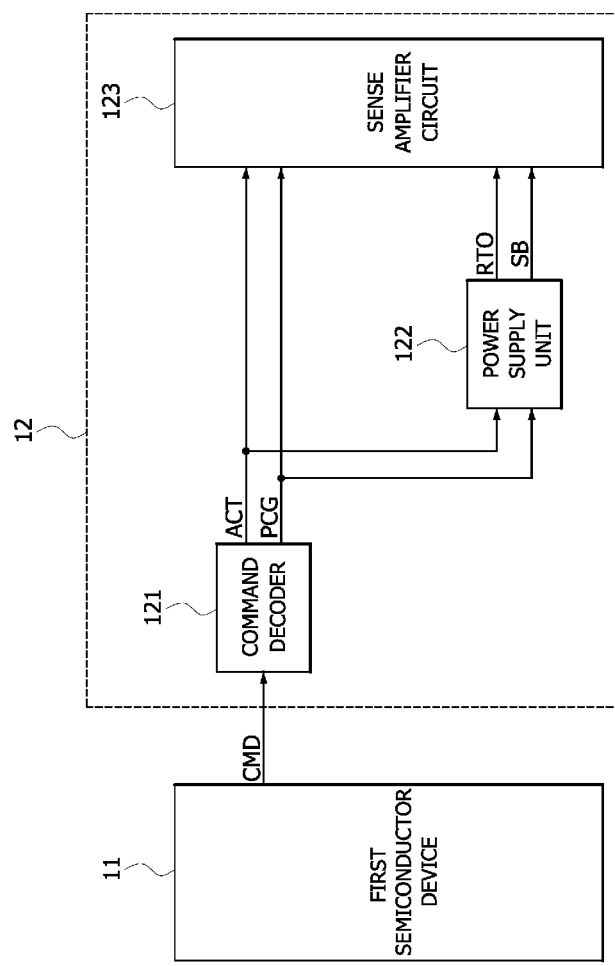
FIG. 1 is a block diagram illustrating a configuration of a semiconductor system according to an embodiment of the present disclosure.

As illustrated in FIG. 1, a semiconductor system according to an embodiment of the present disclosure may include a first semiconductor device 11 and a second semiconductor device 12.

The first semiconductor device 11 may output an external command CMD. The external command CMD may include a plurality of bits. The external command CMD may be transmitted through a dedicated line for the external command CMD, or through lines that carry both the external command CMD and an external address (not illustrated).

A second semiconductor device 12 may include a command decoder 121, a power supply unit 122, and a sense amplifier circuit 123.

The command decoder 121 may decode the external command CMD to generate a precharge signal PCG, which is enabled in a precharge mode, or an active signal ACT, which is enabled in an active mode. The command decoder 121 may generate the precharge signal PCG or the active signal ACT according to a combination of logic levels of the external command CMD. In an embodiment, the combinations of the logic levels of the external command CMD for generating the precharge signal PCG and the active signal ACT may be different from one another.

Figure 3:
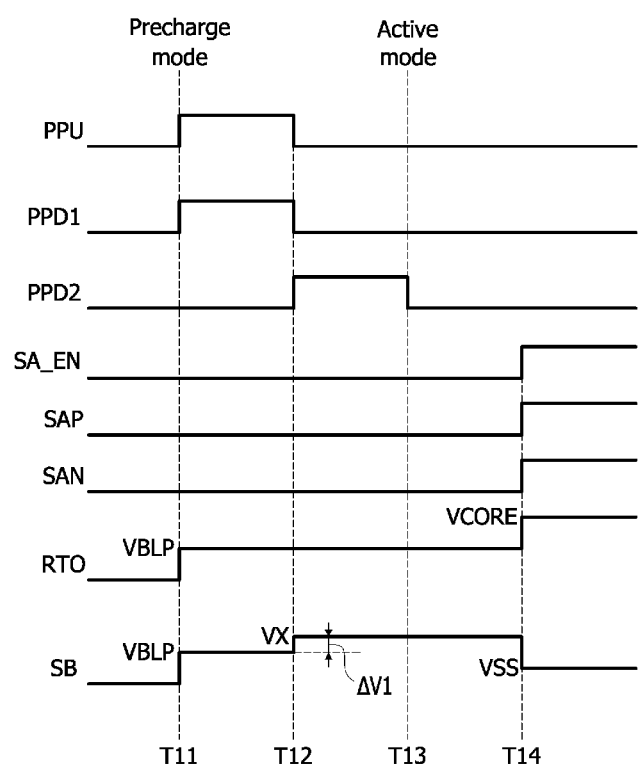
FIG. 3 is a timing diagram illustrating an operation of the power supply unit shown in FIG. 2.
Figure 4:
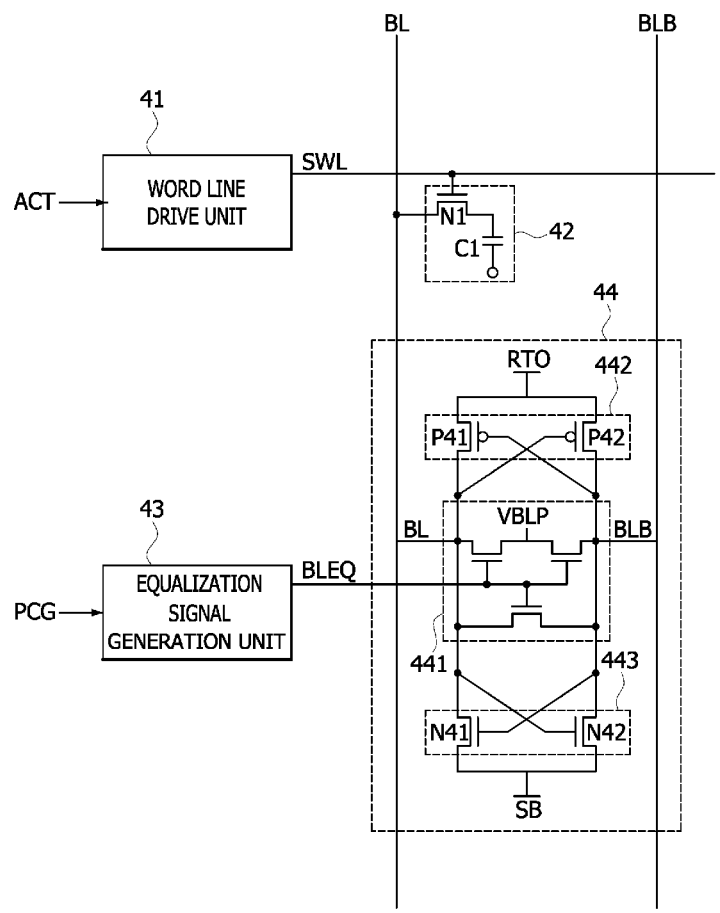
FIG. 4 illustrates a configuration of a sense amplifier circuit included in the semiconductor system of FIG. 1.

The power supply unit 122 may receive the precharge signal PCG and the active signal ACT to generate a first supply voltage RTO and a second supply voltage SB, which are supplied to a bit line sense amplifier (e.g., a bit line sense amplifier 44 shown in FIG. 4). When the power supply unit 122 generates the first supply voltage RTO and the second supply voltage SB, the power supply unit 122 may be coupled selectively to various voltage sources. For instance, the power supply unit 122 may generate the first supply voltage RTO and the second supply voltage SB by using a precharge voltage (e.g., a precharge voltage VBLP shown in FIG. 2) during a first time period from a point in time when the precharge signal PCG is enabled. The power supply unit 122 may adjust a level of the first supply voltage RTO or the second supply voltage SB during a second time period from a point in time when the first time period is terminated to a point in time when the active signal ACT is enabled. If the level of the first supply voltage RTO is adjusted during the second time period, the power supply unit 122 may stop driving the second supply voltage SB during the second time period. If the level of the second supply voltage SB is adjusted during the second time period, the power supply unit 122 may stop driving the first supply voltage RTO during the second time period. The power supply unit 122 may stop driving the first supply voltage RTO and the second supply voltage SB during a third time period from a point in time when the active signal ACT is enabled. The power supply unit 122 may generate the first supply voltage RTO by using a core voltage VCORE and may generate the second supply voltage SB by using a ground voltage VSS, from a point in time when the third time period is terminated. During the third time period, charge sharing occurs between a memory cell (the reference numeral '42' of FIG. 4) and a bit line (e.g., the reference character 'BL' of FIG. 4), and after the third time period, a voltage difference between the bit line BL and a complementary bit line (e.g., the reference character 'BLB' of FIG. 4) may be sensed and amplified. A detailed configuration and a detailed operation of the power supply unit 122 will be described with reference to FIGS. 2 and 3 later.

The sense amplifier circuit 123 may receive the first supply voltage RTO and the second supply voltage SB in response to the precharge signal PCG and the active signal ACT to sense and amplify a voltage difference between the bit line BL of FIG. 4 and the complementary bit line BLB of FIG. 4. The sense amplifier circuit 123 may receive the first supply voltage RTO and the second supply voltage SB to perform a precharge operation in response to the precharge signal PCG and to perform an active operation in response to the active signal ACT. A detailed configuration and a detailed operation of the sense amplifier circuit 123 will be described with reference to FIGS. 4 to 6 later.

Figure 2:
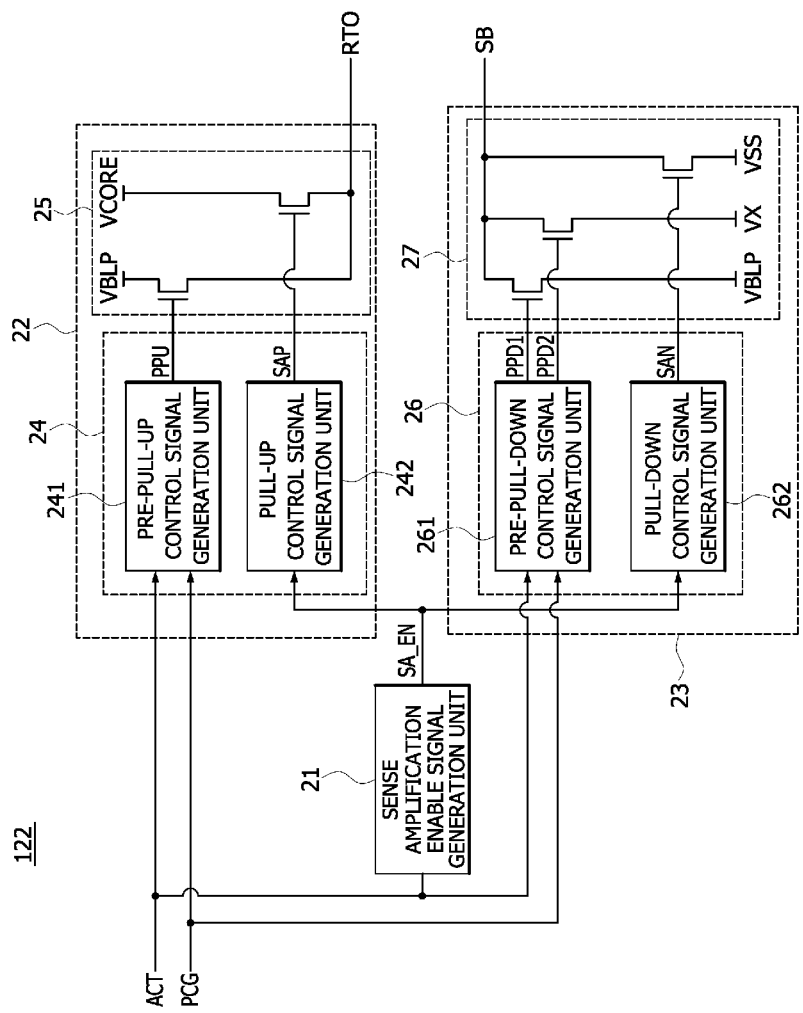
FIG. 2 illustrates a configuration of a power supply unit included in the semiconductor system of FIG. 1.

Referring to FIG. 2, the power supply unit 122 may include a sense amplification enable signal generation unit 21, a first supply voltage generation unit 22, and a second supply voltage generation unit 23.

The sense amplification enable signal generation unit 21 may receive the active signal ACT to generate a sense amplification enable signal SA_EN. The sense amplification enable signal generation unit 21 may generate the sense amplification enable signal SA_EN in response to the active signal ACT. The sense amplification enable signal generation unit 21 may enable the sense amplification enable signal SA_EN after the time period in which charge sharing between the memory cell 42 of FIG. 4 and the bit line BL of FIG. 4 occurs in response to the active signal ACT.

The first supply voltage generation unit 22 may include a first control signal generation unit 24 and a first supply voltage drive unit 25. The first control signal generation unit 24 may include a pre-pull-up control signal generation unit 241 and a pull-up control signal generation unit 242. The pre-pull-up control signal generation unit 241 may generate a pre-pull-up control signal PPU in response to the precharge signal PCG. The pre-pull-up control signal generation unit 241 may enable the pre-pull-up control signal PPU during the first time period from a point in time when the precharge signal PCG is enabled. The pull-up control signal generation unit 242 may generate a pull-up control signal SAP in response to the sense amplification enable signal SA_EN. The pull-up control signal generation unit 242 may enable the pull-up control signal SAP at a point in time when the sense amplification enable signal SA_EN is enabled.

The first supply voltage drive unit 25 may generate the first supply voltage RTO in response to the pre-pull-up control signal PPU and the pull-up control signal SAP. The first supply voltage drive unit 25 may generate the first supply voltage RTO by coupling an output node of the first supply voltage RTO to a voltage source supplying the precharge voltage VBLP in response to the pre-pull-up control signal PPU. The first supply voltage drive unit 25 may generate the first supply voltage RTO by coupling the output node of the first supply voltage RTO to a voltage source supplying the core voltage VCORE in response to the pull-up control signal SAP. The precharge voltage VBLP may have an intermediate level of the core voltage VCORE.

The second supply voltage generation unit 23 may include a second control signal generation unit 26 and a second supply voltage drive unit 27. The second control signal generation unit 26 may include a pre-pull-down control signal generation unit 261 and a pull-down control signal generation unit 262. The pre-pull-down control signal generation unit 261 may generate a first pre-pull-down control signal PPD1 and a second pre-pull-down control signal PPD2 in response to the precharge signal PCG and the active signal ACT. The pre-pull-down control signal generation unit 261 may enable the first pre-pull-down control signal PPD1 during the first time period from a point in time when the precharge signal PCG is enabled. The pre-pull-down control signal generation unit 261 may enable the second pre-pull-down control signal PPD2 during the second time period from a point in time when the first time period is terminated to a point in time when the active signal ACT is enabled. The pull-down control signal generation unit 262 may generate a pull-down control signal SAN in response to the sense amplification enable signal SA_EN. The pull-down control signal generation unit 262 may enable the pull-down control signal SAN which is enabled at a point in time when the sense amplification enable signal SA_EN is enabled.

The second supply voltage drive unit 27 may drive the second supply voltage SB in response to the pre-pull-down control signal PPD1 or PPD2 and the pull-down control signal SAN. In precharge mode, when one of the pre-pull-down control signals PPD1 and PPD2 is enabled, the other of the pre-pull-down control signals PPD1 and PPD2 is disabled. In an embodiment, the second pre-pull-down control signal PPD2 may be provided instead of the first pre-pull-down control signal PPD1 to provide the set voltage VX instead of the precharge voltage VBLP. The second supply voltage drive unit 27 may generate the second supply voltage SB by coupling an output node of the second supply voltage SB to the voltage source supplying the precharge voltage VBLP when the first pre-pull-down control signal PPD1 is enabled. The second supply voltage drive unit 27 may generate the second supply voltage SB by coupling the output node of the second supply voltage SB to a voltage source supplying a set voltage VX when the second pre-pull-down control signal PPD2 is enabled. The set voltage VX may have a higher level than the precharge voltage VBLP. The second supply voltage drive unit 27 may generate the second supply voltage SB by coupling the output node of the second supply voltage SB to a voltage source supplying the ground voltage VSS in response to the pull-down control signal SAN.

An operation of the power supply unit 122 illustrated in FIG. 2 will be described hereinafter with reference to FIG. 3.

The pre-pull-up control signal PPU and the first pre-pull-down control signal PPD1 may be enabled during the first time period from a point in time T11 to a point in time T12 if a precharge mode begins at the point in time T11. The first supply voltage RTO and the second supply voltage SB may be generated by coupling output nodes thereof to the voltage source supplying the precharge voltage VBLP in response to the pre-pull-up control signal PPU and the first pre-pull-down control signal PPD1 which are enabled during the first time period. The pre-pull-up control signal PPU may be disabled from the point in time T12 when the first time period is terminated, and thus a node that provides the precharge voltage VBLP to an output node of the first supply voltage RTO may float. At the point in time T12, the first pre-pull-down control signal PPD1 is disabled and the second pre-pull-down control signal PPD2 is enabled. As a result, during the second time period from the point in time T12 to a point in time T13, the second supply voltage SB may be generated by coupling the output node thereof to the voltage source supplying the set voltage VX in response to the second pre-pull-down control signal PPD2. The set voltage VX may have a higher voltage than the precharge voltage VBLP by a first variation voltage ΔV1. If an active mode begins at the point in time T13, the pre-pull-up control signal PPU, the first pre-pull-down control signal PPD1, and the second pre-pull-down control signal PPD2 may be disabled, and thus during a third time period from the point in time T13 to a point in time T14, the output nodes of the first supply voltage RTO and the second supply voltage SB may float. The pull-up control signal SAP and the pull-down control signal SAN may be enabled in response to the sense amplification enable signal SA_EN which is enabled from the point in time T14 when the third time period is terminated. The first supply voltage RTO may be generated by coupling the output node thereof to the voltage source supplying the core voltage VCORE and the second supply voltage SB may be generated by coupling the output node thereof to the voltage source supplying the ground voltage VSS in response to the pull-up control signal SAP and the pull-down control signal SAN which are enabled at the point in time T14.

Referring to FIG. 4, the sense amplifier circuit 123 may include a word line drive unit 41, the memory cell 42, an equalization signal generation unit 43, and the bit line sense amplifier 44.

The word line drive unit 41 may enable a word line SWL in response to the active signal ACT. The memory cell 42 may include a cell transistor N1 and a cell capacitor C1. If the word line SWL is enabled, the cell transistor N1 of the memory cell 42 may be turned on, and charge sharing between the bit line BL and the cell capacitor C1 occurs.

The equalization signal generation unit 43 may generate an equalization signal BLEQ which is enabled during the first time period in response to the precharge signal PCG.

The bit line sense amplifier 44 may include an equalization unit 441, a first amplification unit 442, and a second amplification unit 443. The equalization unit 441 may precharge the bit line BL and the complementary bit line BLB with the precharge voltage VBLP in response to the equalization signal BLEQ. The precharge voltage VBLP may have an intermediate level of the core voltage VCORE, which is supplied to a core area.

The first amplification unit 442 may include a first PMOS transistor P41 and a second PMOS transistor P42. The first PMOS transistor P41 may supply the first supply voltage RTO to the bit line BL according to the level of the complementary bit line BLB. The second PMOS transistor P42 may supply the first supply voltage RTO to the complementary bit line BLB according to the level of the bit line BL. The second amplification unit 443 may include a first NMOS transistor N41 and a second NMOS transistor N42. The first NMOS transistor N41 may supply the second supply voltage SB to the bit line BL according to the level of the complementary bit line BLB. The second NMOS transistor N42 may supply the second supply voltage SB to the complementary bit line BLB according to the level of the bit line BL.

Figure 5:
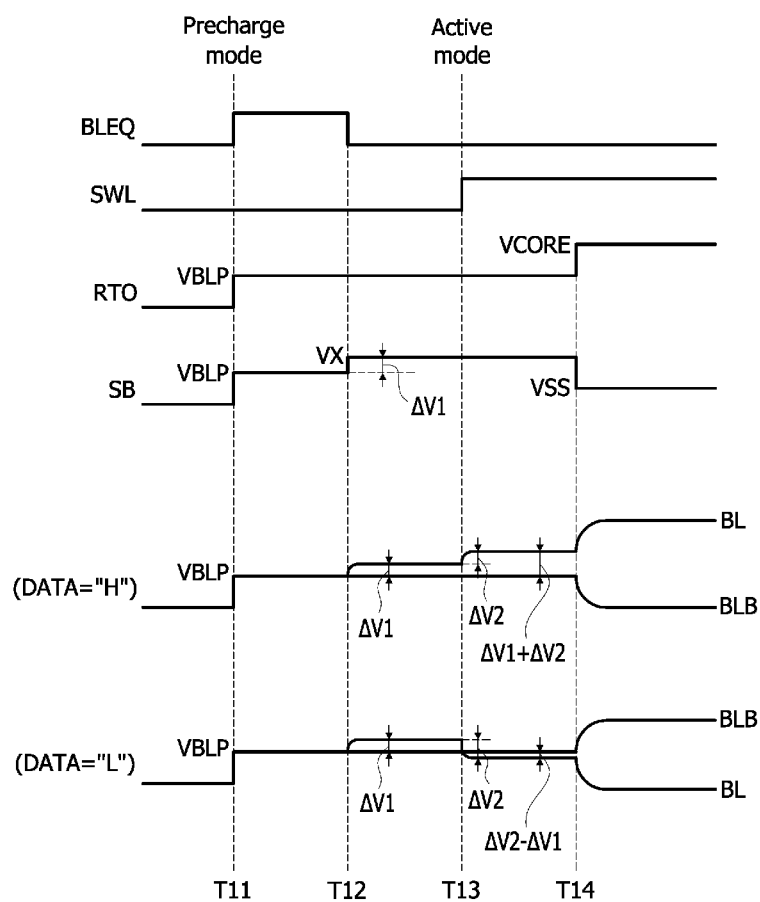
FIG. 5 and FIG. 6 are timing diagrams illustrating an operation of the sense amplifier circuit shown in FIG. 4.

Level changes of the bit line BL and the complementary bit line BLB depending on the time periods will be described hereinafter with reference to FIG. 5 in conjunction with an example in which a threshold voltage of the first NMOS transistor N41 included in the second amplification unit 443 is lower than that of the second NMOS transistor N42 included in the second amplification unit 443.

The bit line BL and the complementary bit line BLB may be generated by coupling the output node thereof to the voltage source supplying the precharge voltage VBLP in response to the equalization signal BLEQ which is enabled during the first time period from the point in time T11 when the precharge mode begins to the point in time T12.

The second supply voltage SB may be generated by coupling the output node thereof to the voltage source supplying the set voltage VX, which is higher than the precharge voltage VBLP, during the second time period from the point in time T12 when the first time period is terminated to the point in time T13 when the active mode begins. The set voltage VX may have a higher voltage than the precharge voltage VBLP by the first variation voltage $\Delta V1$. The first variation voltage $\Delta V1$ may be a threshold voltage difference between the first NMOS transistor N41 and the second NMOS transistor N42. Since the threshold voltage of the first NMOS transistor N41 is lower than the threshold voltage of the second NMOS transistor N42, a voltage at the bit line BL may increase to a voltage higher than a voltage at the complementary bit line BLB by the first variation voltage $\Delta V1$. In this case, since a gate voltage of the second NMOS transistor N42 increases to a voltage higher than a gate voltage of the first NMOS transistor N41 by the first variation voltage $\Delta V1$, a driving force difference between the first NMOS transistor N41 and the second NMOS transistor N42 due to a threshold voltage difference between the first NMOS transistor N41 and the second NMOS transistor N42 may be offset by a gate voltage difference between the first and second NMOS transistors N41 and N42. Accordingly, a current flowing through the first NMOS transistor N41 may be equal to a current flowing through the second NMOS transistor N42 during the second time period.

If a data bit having a logic high level (DATA="H") is stored in the memory cell 42, charge sharing may occur between the cell capacitor C1 and the bit line BL during the third time period between the point in time T13 and the point in time T14 in response to a voltage of the word line SWL which is pulled up to a logic high level at the point in time T13. If the charge sharing occurs, the data bit having a logic high level may be loaded on the bit line BL, and a voltage level of the bit line BL may increase by a second variation voltage $\Delta V2$. At this time, a difference between voltage levels of the bit line BL and the complementary bit line BLB may correspond to a sum ($\Delta V1+\Delta V2$) of the first variation voltage $\Delta V1$ and the second variation voltage $\Delta V2$. At the point in time T14, the first supply voltage RTO is generated by coupling the output node thereof to the voltage source supplying the core voltage VCORE and the second supply voltage SB is generated by coupling the output node thereof to the voltage source supplying the ground voltage VSS, and a voltage difference between the bit line BL and the complementary bit line BLB may be sensed and amplified.

If a data bit having a logic low level (DATA="L") is stored in the memory cell 42, charge sharing may occur between the cell capacitor C1 and the bit line BL during the third time period between the point in time T13 and the point in time T14 in response to a voltage of the word line SWL which is pulled up to a logic high level at the point in time T13. If the charge sharing occurs, the data bit having a logic low level may be loaded on the bit line BL, and thus the voltage level of the bit line BL may decrease by the second variation voltage $\Delta V2$. At this time, a difference between the voltage levels of the bit line BL and the complementary bit line BLB may correspond to a voltage ($\Delta V2-\Delta V1$) that remains after subtracting the first variation voltage $\Delta V1$ from the second variation voltage $\Delta V2$. At the point in time T14, the first supply voltage RTO is generated by coupling the output node thereof to the voltage source supplying the core voltage VCORE and the second supply voltage SB is generated by coupling the output node thereof to the voltage source supplying the ground voltage VSS, and a voltage difference between the bit line BL and the complementary bit line BLB may be sensed and amplified.

As described above, a level of the bit line BL may be adjusted by the second variation voltage $\Delta V2$ due to the charge sharing phenomenon in a situation where a current flowing through the first NMOS transistor N41 is equal to a current flowing through the second NMOS transistor N42. Thus, even if the threshold voltage of the first NMOS transistor N41 is lower than that of the second NMOS transistor N42, a voltage difference between the bit line BL and the complementary bit line BLB may be sensed and amplified without error.

Figure 6:
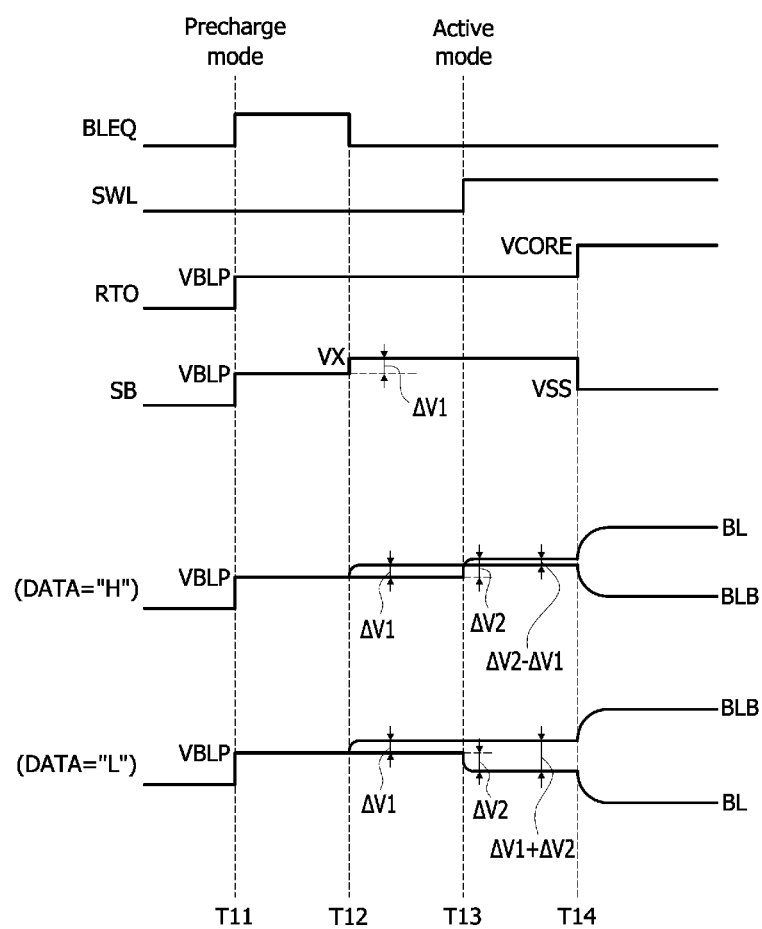

Level changes of the bit line BL and the complementary bit line BLB depending on the time periods will be described hereinafter with reference to FIG. 6 in conjunction with an example in which a threshold voltage of the second NMOS transistor N42 included in the second amplification unit 443 is lower than that of the first NMOS transistor N41 included in the second amplification unit 443.

The bit line BL and the complementary bit line BLB may be pulled to the precharge voltage VBLP in response to the equalization signal BLEQ which is enabled during the first time period from the point in time T11 when the precharge mode begins to the point in time T12.

The second supply voltage SB may be generated by coupling the output node thereof to the voltage source supplying the set voltage VX, which is higher than the precharge voltage VBLP, during the second time period from the point in time T12 when the first time period terminates to the point in time T13 when the active mode begins. The set voltage VX may be higher than the precharge voltage VBLP by the first variation voltage $\Delta V1$. The first variation voltage $\Delta V1$ may be a difference between threshold voltages of the first NMOS transistor N41 and the second NMOS transistor N42. Since the threshold voltage of the second NMOS transistor N42 is lower than the threshold voltage of the first NMOS transistor N41, a voltage at the complementary bit line BLB may increase to a voltage higher than the voltage of the bit line BL by the first variation voltage $\Delta V1$. In this case, since a gate voltage of the first NMOS transistor N41 increases to a voltage higher than a gate voltage of the second NMOS transistor N42 by the first variation voltage $\Delta V1$, a driving force difference between the first NMOS transistor N41 and the second NMOS transistor N42 due to a threshold voltage difference between the first NMOS transistor N41 and the second NMOS transistor N42 may be offset by a gate voltage difference between the first and second NMOS transistors N41 and N42. Accordingly, a current flowing through the first NMOS transistor N41 may be equal to a current flowing through the second NMOS transistor N42 during the second time period.

If a data bit having a logic high level (DATA="H") is stored in the memory cell 42, charge sharing may occur between the cell capacitor C1 and the bit line BL during the third time period between the point in time T13 and the point in time T14 in response to a voltage of the word line SWL which is pulled up to a logic high level at the point in time T13. If the charge sharing occurs, the data bit having a logic high level may be loaded on the bit line BL, and the voltage level of the bit line BL may increase by the second variation voltage $\Delta V2$. At this time, a difference between the voltage levels of the bit line BL and the complementary bit line BLB may correspond to a voltage ($\Delta V2-\Delta V1$) that remains after subtracting the first variation voltage $\Delta V1$ from the second variation voltage $\Delta V2$. At the point in time T14, the first supply voltage RTO is driven to the core voltage VCORE and the second supply voltage SB is driven to the ground voltage VSS, and a voltage difference between the bit line BL and the complementary bit line BLB may be sensed and amplified.

If a data bit having a logic low level (DATA="L") is stored in the memory cell 42, charge sharing may occur between the cell capacitor C1 and the bit line BL during the third time period between the point in time T13 and the point in time T14 in response to a voltage of the word line SWL which is pulled up to a logic high level at the point in time T13. If the charge sharing occurs, the data bit having a logic low level may be loaded on the bit line BL, and the voltage level of the bit line BL may decrease by the second variation voltage $\Delta V2$. At this time, a difference between voltage levels of the bit line BL and the complementary bit line BLB may correspond to a sum ($\Delta V1+\Delta V2$) of the first variation voltage $\Delta V1$ and the second variation voltage $\Delta V2$. At the point in time T14, the first supply voltage RTO is driven to the core voltage VCORE and the second supply voltage SB is driven to the ground voltage VSS, and a voltage difference between the bit line BL and the complementary bit line BLB may be sensed and amplified.

As described above, a level of the bit line BL may be adjusted by the second variation voltage $\Delta V2$ by the charge sharing phenomenon in a situation where a current flowing through the first NMOS transistor N41 is equal to a current flowing through the second NMOS transistor N42. Thus, even if the threshold voltage of the second NMOS transistor N42 is lower than that of the first NMOS transistor N41, a voltage difference between the bit line BL and the complementary bit line BLB may be sensed and amplified without error.

Figure 7:
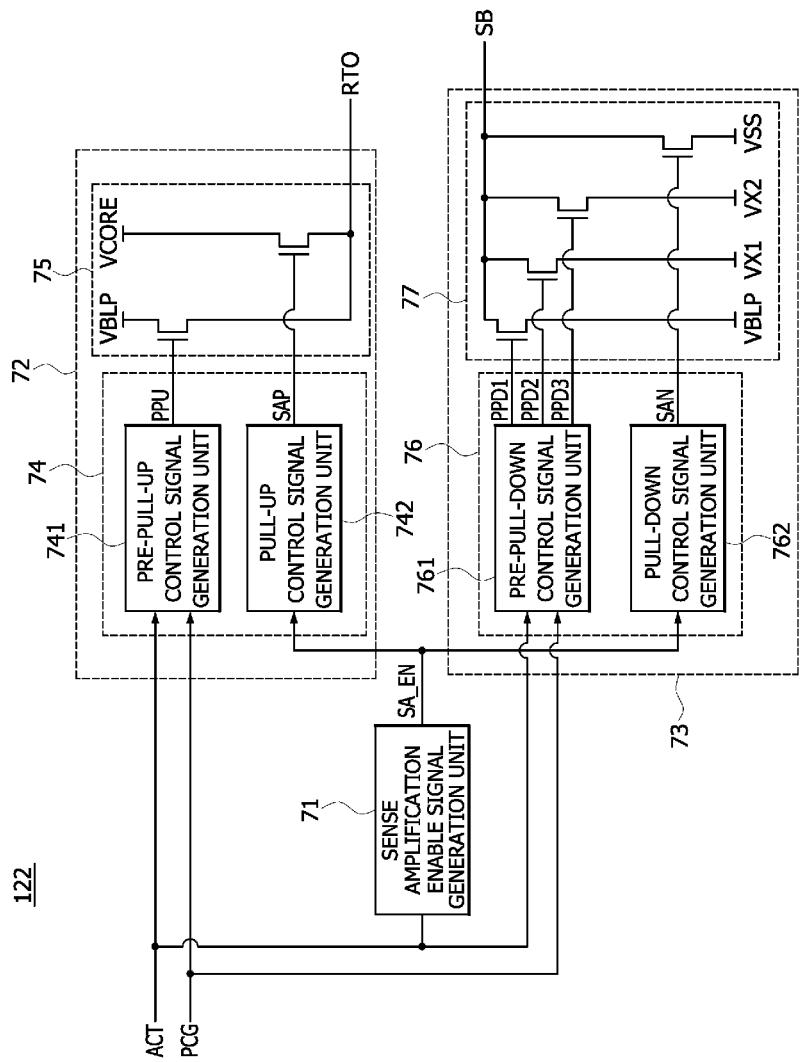
FIG. 7 illustrates an example of the power supply unit included in the semiconductor system of FIG. 1.

FIG. 7 illustrates an example of the power supply unit 122. Referring to FIG. 7, the power supply unit 122 may include a sense amplification enable signal generation unit 71, a first supply voltage generation unit 72, and a second supply voltage generation unit 73.

The sense amplification enable signal generation unit 71 may receive the active signal ACT to generate a sense amplification enable signal SA_EN. The sense amplification enable signal generation unit 71 may generate the sense amplification enable signal SA_EN in response to the active signal ACT. The sense amplification enable signal generation unit 71 may enable the sense amplification enable signal SA_EN after the time period in which charge sharing occurs between the memory cell 42 and the bit line BL in response to the active signal ACT.

The first supply voltage generation unit 72 may include a first control signal generation unit 74 and a first supply voltage drive unit 75. The first control signal generation unit 74 may include a pre-pull-up control signal generation unit 741 and a pull-up control signal generation unit 742. The pre-pull-up control signal generation unit 741 may generate a pre-pull-up control signal PPU in response to the precharge signal PCG. The pre-pull-up control signal generation unit 741 may generate the pre-pull-up control signal PPU which is enabled during the first time period from a point in time when the precharge signal PCG is enabled. The pull-up control signal generation unit 742 may generate a pull-up control signal SAP in response to the sense amplification enable signal SA_EN. The pull-up control signal generation unit 742 may enable the pull-up control signal SAP at a point in time when the sense amplification enable signal SA_EN is enabled.

The first supply voltage drive unit 75 may generate the first supply voltage RTO in response to the pre-pull-up control signal PPU and the pull-up control signal SAP. The first supply voltage drive unit 75 may generate the first supply voltage RTO by coupling the output node thereof to the voltage source supplying the precharge voltage VBLP in response to the pre-pull-up control signal PPU. The first supply voltage drive unit 75 may generate the first supply voltage RTO by coupling the output node thereof to the voltage source supplying the core voltage VCORE in response to the pull-up control signal SAP. The precharge voltage VBLP may have an intermediate level of the core voltage VCORE.

The second supply voltage generation unit 73 may include a second control signal generation unit 76 and a second supply voltage drive unit 77. The second control signal generation unit 76 may include a pre-pull-down control signal generation unit 761 and a pull-down control signal generation unit 762. The pre-pull-down control signal generation unit 761 may generate a first pre-pull-down control signal PPD1, a second pre-pull-down control signal PPD2, and a third pre-pull-down control signal PPD3 in response to the precharge signal PCG and the active signal ACT. The pre-pull-down control signal generation unit 761 may enable the first pre-pull-down control signal PPD1 during the first time period from a point in time when the precharge signal PCG is enabled. The pre-pull-down control signal generation unit 761 may generate the second pre-pull-down control signal PPD2 and the third pre-pull-down control signal PPD3 during the second time period from a point in time when the first time period is terminated to a point in time when the active signal ACT is enabled. The pre-pull-down control signal generation unit 761 may enable the second pre-pull-up control signal PPD2 from the point in time when the second time period begins and may enable the third pre-pull-down control signal PPD3 from the point in time when the second pre-pull-down control signal PPD2 is disabled to the point in time when the second time period is terminated. The pull-down control signal generation unit 762 may generate a pull-down control signal SAN in response to the sense amplification enable signal SA_EN. The pull-down control signal generation unit 762 may enable the pull-down control signal SAN at a point of time when the sense amplification enable signal SA_EN is enabled.

The second supply voltage drive unit 77 may generate the second supply voltage SB in response to the pre-pull-down control signal PPD1, PPD2, and PPD3, and the pull-down control signal SAN. In precharge mode, one of the pre-pull-down control signals PPD1, PPD2, and PPD3 is enabled and the others are disabled. In an embodiment, the second and third pre-pull-down control signals PPD2 and PPD3 may be provided instead of the first pre-pull-down control signal PPD1 to provide first and second set voltages VX1 and VX2 instead of the precharge voltage VBLP. The second supply voltage drive unit 77 may generate the second supply voltage SB by coupling the output node thereof to the voltage source supplying the precharge voltage VBLP when the first pre-pull-down control signal PPD1 is enabled. The second supply voltage drive unit 77 may generate the second supply voltage SB by coupling the output node thereof to a voltage source supplying a first set voltage VX1 when the second pre-pull-down control signal PPD2 is enabled. The second supply voltage drive unit 77 may generate the second supply voltage SB by coupling the output node thereof to a voltage source supplying a second set voltage VX2 when the third pre-pull-down control signal PPD3 at enabled. The first set voltage VX1 may have a higher level than the precharge voltage VBLP. The second set voltage VX2 may have a higher level than the first set voltage VX1. The second supply voltage drive unit 77 may generate the second supply voltage SB by coupling the output node thereof to the voltage source supplying the ground voltage VSS in response to the pull-down control signal SAN.

An operation of the power supply unit 122 illustrated in FIG. 7 will be described hereinafter with reference to FIG. 8.

If a precharge mode begins at a point in time T21, the pre-pull-up control signal PPU and the first pre-pull-down control signal PPD1 may be enabled during the first time period from the point in time T21 when the precharge mode begins to a point in time T22. The first supply voltage RTO and the second supply voltage SB may be generated by coupling the output nodes thereof to the voltage source supplying the precharge voltage VBLP in response to the pre-pull-up control signal PPU and the first pre-pull-down control signal PPD1 which are enabled during the first time period. The pre-pull-up control signal PPU may be disabled from the point in time T22 when the first time period is terminated. Thus, the first supply voltage RTO may float. The first pre-pull-down control signal PPD1 may be disabled from the point in time T22 when the first time period is terminated, and the second supply voltage SB may be generated by coupling the output node thereof to the voltage source supplying the first set voltage VX1 in response to the second pre-pull-down control signal PPD2 which is enabled from the point in time T22. The second supply voltage SB may be generated by coupling the output node thereof to the voltage source supplying the second set voltage VX2 in response to the third pre-pull-down control signal PPD3 which is enabled from the point in time when the second pre-pull-down control signal PPD2 is disabled to the point in time T23 when the active mode begins. The first set voltage VX1 may be higher than the precharge voltage VBLP, and the second set voltage VX2 may be higher than the first set voltage VX1. The second set voltage VX2 may be higher than the precharge voltage VBLP by the first variation voltage $\Delta V1$, and the first set voltage VX1 may have an intermediate level between the precharge voltage VBLP and the second set voltage VX2. The first variation voltage $\Delta V1$ may have a threshold voltage difference between the first NMOS transistor N41 and the second NMOS transistor N42. If the active mode begins at a point in time T23, the pre-pull-up control signal PPU, the first pre-pull-down control signal PPD1, the second pre-pull-down control signal PPD2, and the third pre-pull-down control signal PPD3 may be disabled during a third time period between the point in time T23 and a point in time T24. Thus the output nodes of the first supply voltage RTO and the second supply voltage SB may float. The pull-up control signal SAP and the pull-down control signal SAN may be enabled in response to the sense amplification enable signal SA_EN which is enabled from the point in time T24 when the third time period is terminated. The first supply voltage RTO may be generated by coupling the output node thereof to the voltage source supplying the core voltage VCORE and the second supply voltage SB may be generated by coupling the output node thereof to the voltage source supplying the ground voltage VSS in response to the pull-up control signal SAP and the pull-down control signal SAN which are enabled from the point in time T24.

Figure 8:
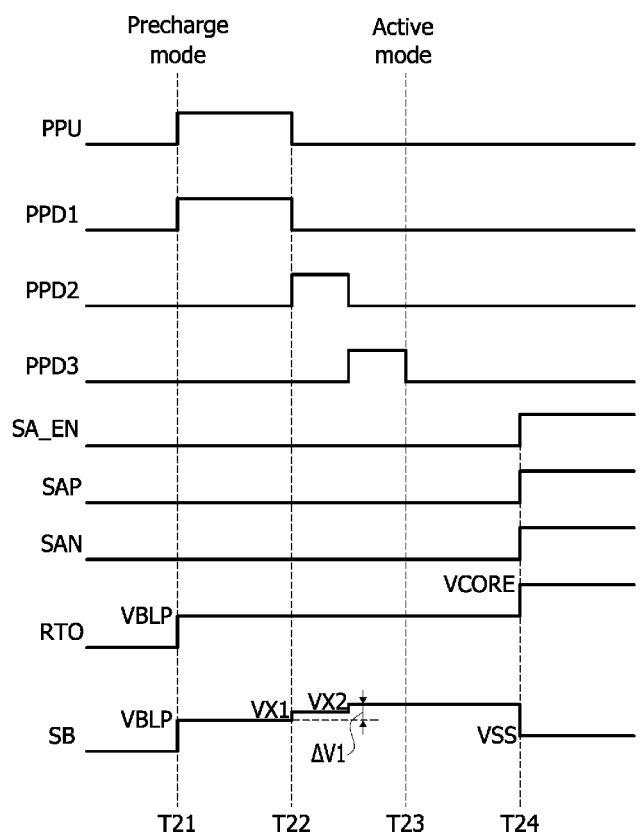
FIG. 8 is a timing diagram illustrating an operation of the power supply unit shown in FIG. 7.

As described above, the power supply units 122 illustrated in FIG. 7 and FIG. 8 may adjust the second supply voltage SB though two steps during the second time period, unlike the power supply units 122 illustrated in FIG. 2 and FIG. 3. If the second supply voltage SB is adjusted during the second time period, while the voltage levels of the bit line BL and the complementary bit line BLB are being adjusted, a noise may be caused in a peripheral circuit. Accordingly, the second supply voltage generation unit 73 may increase the second supply voltage SB to the first set voltage VX1 and then to the second set voltage VX2 to reduce the noise.

Figure 9:
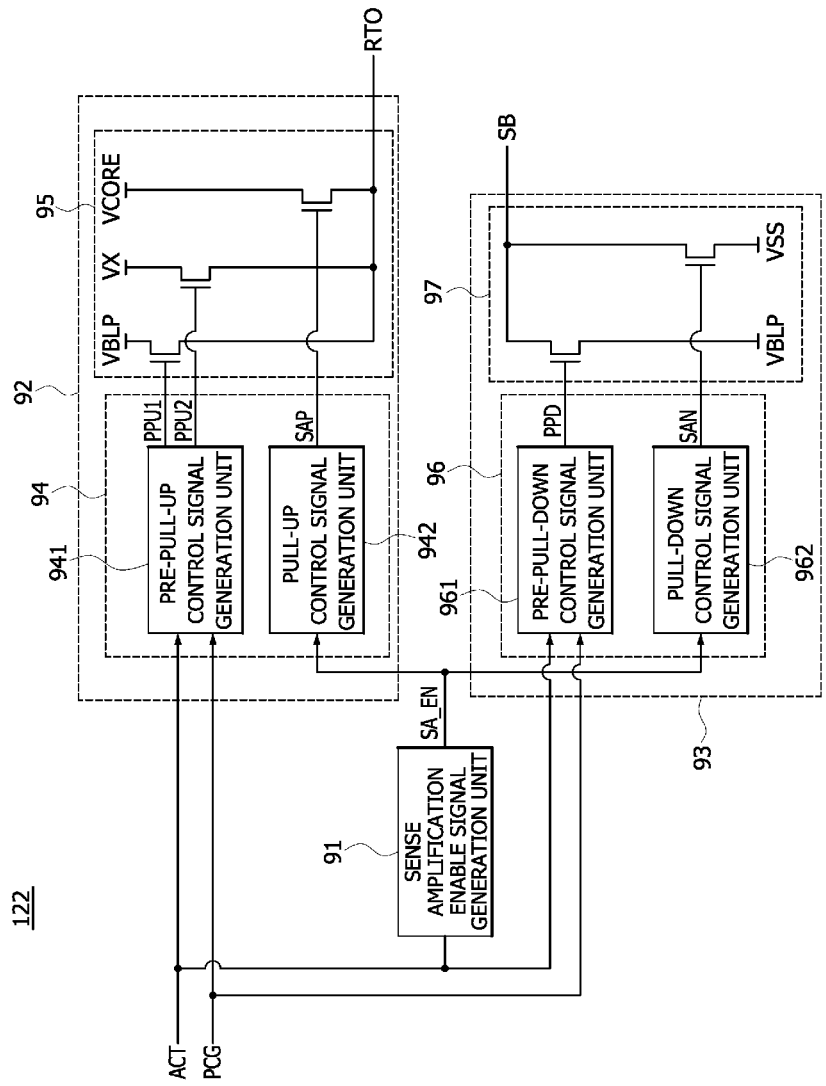
FIG. 9 illustrates an example of the power supply unit included in the semiconductor system of FIG. 1.

FIG. 9 illustrates an example of the power supply unit 122. Referring to FIG. 9, the power supply unit 122 may include a sense amplification enable signal generation unit 91, a first supply voltage generation unit 92, and a second supply voltage generation unit 93.

The sense amplification enable signal generation unit 91 may receive the active signal ACT to generate a sense amplification enable signal SA_EN. The sense amplification enable signal generation unit 91 may generate the sense amplification enable signal SA_EN in response to the active signal ACT. The sense amplification enable signal generation unit 91 may enable the sense amplification enable signal SA_EN after the time period when charge sharing occurs in response to the active signal ACT.

The first supply voltage generation unit 92 may include a first control signal generation unit 94 and a first supply voltage drive unit 95. The first control signal generation unit 94 may include a pre-pull-up control signal generation unit 941 and a pull-up control signal generation unit 942. The pre-pull-up control signal generation unit 941 may generate a first pre-pull-up control signal PPU1 and a second pre-pull-up control signal PPU2 in response to the precharge signal PCG and the active signal ACT. The pre-pull-up control signal generation unit 941 may enable the first pre-pull-up control signal PPU1 during the first time period from a point in time when the precharge signal PCG is enabled. The pre-pull-up control signal generation unit 941 may enable the second pre-pull-up control signal PPU2 during the second time period from a point in time when the first time period is terminated to a point in time when the active signal ACT is enabled. The pull-up control signal generation unit 942 may generate a pull-up control signal SAP in response to the sense amplification enable signal SA_EN. The pull-up control signal generation unit 942 may enable the pull-up control signal SAP at a point in time when the sense amplification enable signal SA_EN is enabled.

The first supply voltage drive unit 95 may generate the first supply voltage RTO in response to the pre-pull-up control signal PPU1 or PPU2 and the pull-up control signal SAP. In precharge mode, when one of pre-pull-up control signals PPU1 and PPU2 is enabled, the other of the pre-pull-up control signals PPU1 and PPU2 is disabled. In an embodiment, the second pre-pull-up control signal PPU2 may be provided instead of the first pre-pull-up control signal PPU1 to provide a set voltage VX instead of the precharge voltage VBLP. The first supply voltage drive unit 95 may generate the first supply voltage RTO by coupling the output node thereof to the voltage source supplying the precharge voltage VBLP in response to the first pre-pull-up control signal PPU1. The first supply voltage drive unit 95 may generate the first supply voltage RTO by coupling the output node thereof to the voltage source supplying the set voltage VX in response to the second pre-pull-up control signal PPU2. The set voltage VX may be lower than the precharge voltage VBLP. The first supply voltage drive unit 95 may generate the first supply voltage RTO by coupling the output node thereof to the voltage source supplying the core voltage VCORE in response to the pull-up control signal SAP. The precharge voltage VBLP may have an intermediate level of the core voltage VCORE.

The second supply voltage generation unit 93 may include a second control signal generation unit 96 and a second supply voltage drive unit 97. The second control signal generation unit 96 may include a pre-pull-down control signal generation unit 961 and a pull-down control signal generation unit 962. The pre-pull-down control signal generation unit 961 may generate a pre-pull-down control signal PPD in response to the precharge signal PCG. The pre-pull-down control signal generation unit 961 may enable the pre-pull-down control signal PPD during the first time period from a point in time when the precharge signal PCG is enabled. The pull-down control signal generation unit 962 may generate a pull-down control signal SAN in response to the sense amplification enable signal SA_EN. The pull-down control signal generation unit 962 may enable the pull-down control signal SAN at a point in time when the sense amplification enable signal SA_EN is enabled.

The second supply voltage drive unit 97 may generate the second supply voltage SB in response to the pre-pull-down control signal PPD and the pull-down control signal SAN. The second supply voltage drive unit 97 may generate the second supply voltage SB by coupling the output node thereof to the voltage source supplying the precharge voltage VBLP in response to the pre-pull-down control signal PPD. The second supply voltage drive unit 97 may generate the second supply voltage SB by coupling the output node thereof to the voltage source supplying the ground voltage VSS in response to the pull-down control signal SAN.

Figure 10:
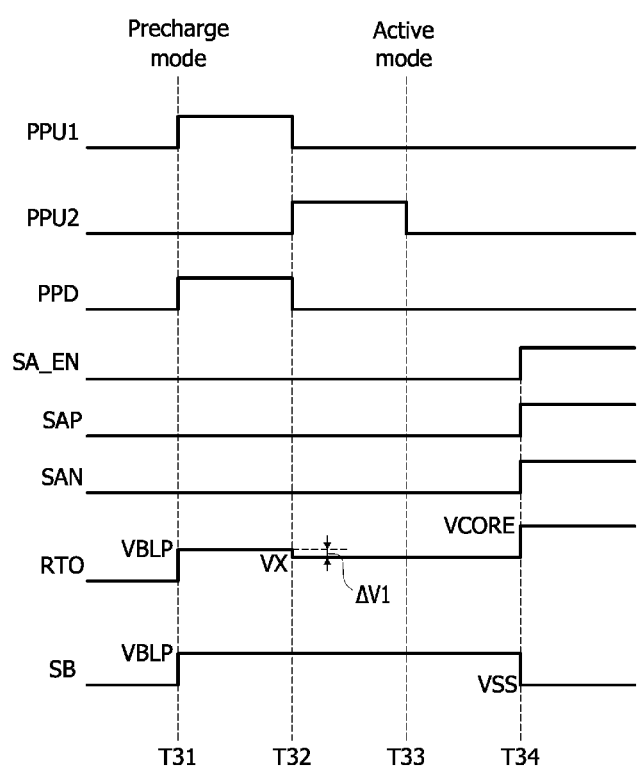
FIG. 10 is a timing diagram illustrating an operation of the power supply unit shown in FIG. 9.

An operation of the power supply unit 122 illustrated in FIG. 9 will be described hereinafter with reference to FIG. 10.

If a precharge mode begins at a point in time T31, The first pre-pull-up control signal PPU1 and the pre-pull-down control signal PPD may be enabled during the first time period from the point in time T31 to a point in time T32. The first supply voltage RTO and the second supply voltage SB may be generated by coupling the output node thereof to the voltage source supplying the precharge voltage VBLP in response to the first pre-pull-up control signal PPU1 and the pre-pull-down control signal PPD which are enabled during the first time period. The first pre-pull-up control signal PPU1 may be disabled from the point in time T32 when the first time period is terminated, and the first supply voltage RTO may be generated by coupling the output node thereof to the voltage source supplying the set voltage VX in response to the second pre-pull-up control signal PPU2 which is enabled during the second time period from the point in time T32 to a point in time T33. The set voltage VX may be lower than the precharge voltage VBLP by the first variation voltage $\Delta V1$. The pre-pull-down control signal PPD may be disabled from the point in time T32 when the first time period is terminated. Thus, a level of the first supply voltage SB may float. If the active mode begins at the point in time T33, the first and second pre-pull-up control signals PPU1 and PPU2 and the pre-pull-down control signal PPD may be disabled during a third time period from the point in time T33 to a point in time T34 to allow the output nodes of the first supply voltage RTO and the second supply voltage SB to float. The pull-up control signal SAP and the pull-down control signal SAN may be enabled in response to the sense amplification enable signal SA_EN which is enabled from the point in time T34 when the third time period is terminated. The first supply voltage RTO may be generated by coupling the output node thereof to the voltage source supplying the core voltage VCORE and the second supply voltage SB may be generated by coupling the output node thereof to the voltage source supplying the ground voltage VSS in response to the pull-up control signal SAP and the pull-down control signal SAN which are enabled from the point in time T34.

Figure 11:
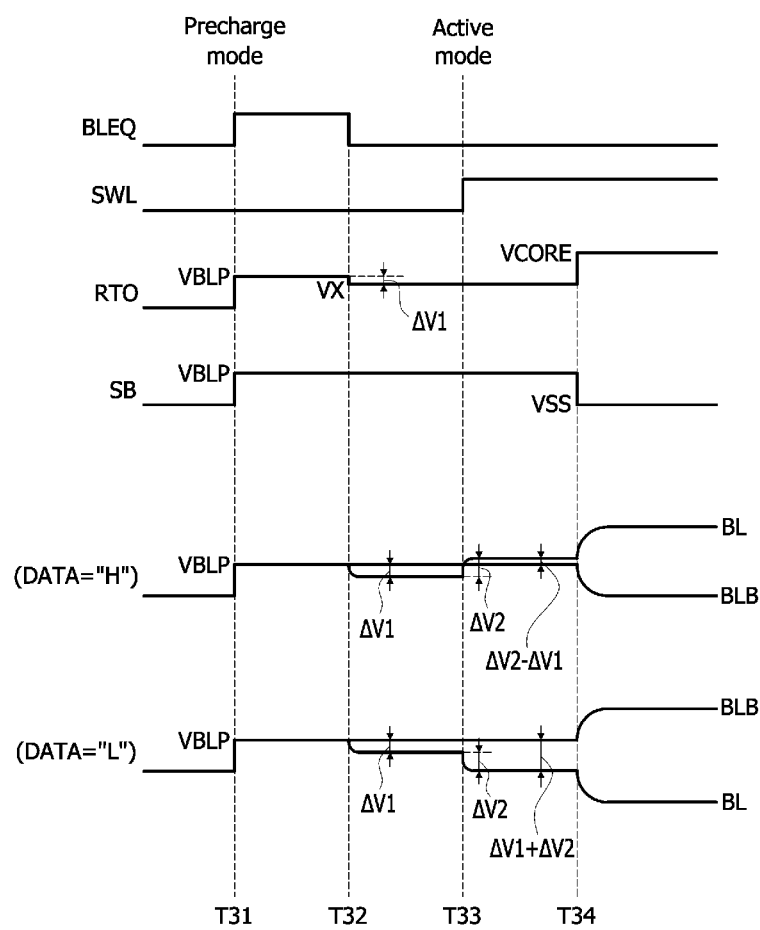
FIG. 11 and FIG. 12 are timing diagrams illustrating an operation of the sense amplifier circuit shown in FIG. 4.
Figure 12:
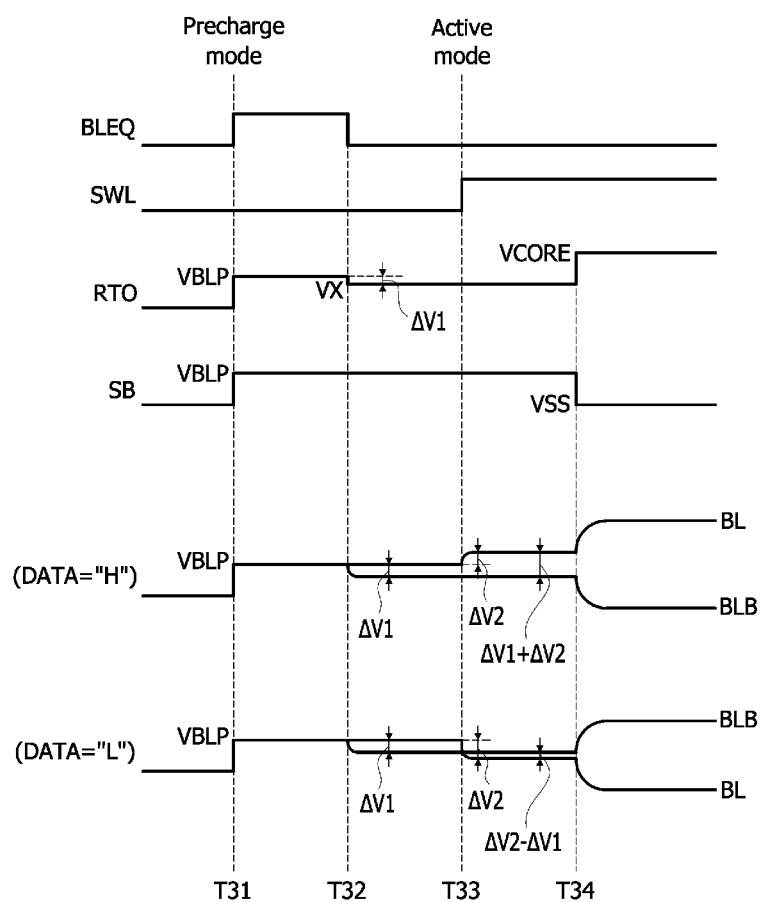

FIG. 11 and FIG. 12 are timing diagrams illustrating an operation of the sense amplifier circuit 123 which receives the first supply voltage RTO and the second supply voltage SB from the power supply unit 122 of FIG. 9.

Level changes of the bit line BL and the complementary bit line BLB depending on the time periods will be described hereinafter with reference to FIG. 11 in conjunction with an example in which a threshold voltage (e.g., an absolute value) of the first PMOS transistor P41 included in the first amplification unit 442 is lower than a threshold voltage (e.g., an absolute value) of the second PMOS transistor P42 included in the first amplification unit 442.

The bit line BL and the complementary bit line BLB may be generated by coupling the output node thereof to the voltage source supplying the precharge voltage VBLP in response to the equalization signal BLEQ which is enabled during the first time period from the point in time T31 when the precharge mode begins to the point in time T32.

The first supply voltage RTO may be generated by coupling the output node thereof to the voltage source supplying the set voltage VX which is lower than the precharge voltage VBLP during the second time period from the point in time T32 when the first time period terminates to the point in time T33 when the active mode begins. The set voltage VX may be lower than the precharge voltage VBLP by the first variation voltage ΔV1. The first variation voltage ΔV1 may be a threshold voltage difference between the first PMOS transistor P41 and the second PMOS transistor P42. Since the threshold voltage of the first PMOS transistor P41 is lower than the threshold voltage of the second PMOS transistor P42, the first supply voltage RTO may be supplied to the bit line BL. Thus, a voltage of the bit line BL may decrease to a voltage lower than a voltage of the complementary bit line BLB by the first variation voltage ΔV1. In this case, since a gate voltage of the second PMOS transistor P42 decreases to a voltage lower than a gate voltage of the first PMOS transistor P41 by the first variation voltage ΔV1, a driving force difference between the first PMOS transistor P41 and the second PMOS transistor P42 due to a threshold voltage difference between the first PMOS transistor P41 and the second PMOS transistor P42 may be offset by a gate voltage difference between the first and second PMOS transistors P41 and P42. Accordingly, a current flowing through the first PMOS transistor P41 may be equal to a current flowing through the second PMOS transistor P42 during the second time period.

If a data bit having a logic high level (DATA="H") is stored in the memory cell 42, charge sharing may occur between the cell capacitor C1 and the bit line BL during the third time period between the point in time T33 and the point in time T34 in response to a voltage of the word line SWL which is pulled up to a logic high level at the point in time T33. If the charge sharing occurs, the data bit having a logic high level may be loaded on the bit line BL, and the voltage level of the bit line BL may increase by the second variation voltage ΔV2. At this time, a difference between the voltage levels of the bit line BL and the complementary bit line BLB may correspond to a voltage (ΔV2−ΔV1) that remains after subtracting the first variation voltage ΔV1 from the second variation voltage ΔV2. At the point in time T34, the first supply voltage RTO is driven to the core voltage VCORE and the second supply voltage SB is driven to the ground voltage VSS, and a voltage difference between the bit line BL and the complementary bit line BLB may be sensed and amplified.

If a data bit having a logic low level (DATA="L") is stored in the memory cell 42, charge sharing may occur between the cell capacitor C1 and the bit line BL during the third time period between the point in time T33 and the point in time T34 in response to a voltage of the word line SWL which is pulled up to a logic high level at the point in time T33. If the charge sharing occurs, the data bit having a logic low level may be loaded on the bit line BL, and thus the voltage level of the bit line BL may decrease by the second variation voltage ΔV2. At this time, a difference between voltage levels of the bit line BL and the complementary bit line BLB may correspond to a sum (ΔV1+ΔV2) of the first variation voltage ΔV1 and the second variation voltage ΔV2. At the point in time T34, a voltage difference between the bit line BL and the complementary bit line BLB may be sensed and amplified so that the first supply voltage RTO is generated by coupling the output node thereof to the voltage source supplying the core voltage VCORE and the second supply voltage SB is generated by coupling the output node thereof to the voltage source supplying the ground voltage VSS.

As described above, a level of the bit line BL may be adjusted by the second variation voltage ΔV2 due to the charge sharing in a situation where a current flowing through the first PMOS transistor P41 is equal to a current flowing through the second PMOS transistor P42. Thus, even if the threshold voltage of the first PMOS transistor P41 is lower than that of the second PMOS transistor P42, a voltage difference between the bit line BL and the complementary bit line BLB may be sensed and amplified without error.

Level changes of the bit line BL and the complementary bit line BLB depending on the time periods will be described hereinafter with reference to FIG. 12 in conjunction with an example in which a threshold voltage (an absolute value) of the second PMOS transistor P42 included in the first amplification unit 442 is lower than a threshold voltage (an absolute value) of the first PMOS transistor P41 included in the first amplification unit 442.

The bit line BL and the complementary bit line BLB may be generated by coupling the output node thereof to the voltage source supplying the precharge voltage VBLP in response to the equalization signal BLEQ which is enabled during the first time period from the point in time T31 when the precharge mode begins to the point in time T32.

The first supply voltage RTO may be generated by coupling the output node thereof to the voltage source supplying the set voltage VX which is lower than the precharge voltage VBLP during the second time period from the point in time T32 when the first time period terminates to the point in time T33 when the active mode begins. The set voltage VX may be lower than the precharge voltage VBLP by the first variation voltage ΔV1. The first variation voltage ΔV1 may be a threshold voltage difference between the first PMOS transistor P41 and the second PMOS transistor P42. Since the threshold voltage of the second PMOS transistor P42 is lower than the threshold voltage of the first PMOS transistor P41, the first supply voltage RTO may be supplied to the complementary bit line BLB. Thus, a voltage of the complementary bit line BL may decrease to a voltage lower than a voltage of the bit line BL by the first variation voltage ΔV1. In this case, since a gate voltage of the first PMOS transistor P41 decreases to a voltage lower than a gate voltage of the second PMOS transistor P42 by the first variation voltage ΔV1, a driving force difference between the first PMOS transistor P41 and the second PMOS transistor P42 due to a threshold voltage difference between the first PMOS transistor P41 and the second PMOS transistor P42 may be offset by a gate voltage difference between the first and second PMOS transistors P41 and P42. Thus, a current flowing through the first PMOS transistor P41 may be equal to a current flowing through the second PMOS transistor P42 during the second time period.

If a data bit having a logic high level (DATA="H") is stored in the memory cell 42, charge sharing may occur between the cell capacitor C1 and the bit line BL during the third time period between the point in time T33 and the point in time T34 in response to a voltage of the word line SWL which is enabled at the point in time T33. If the charge sharing occurs, the data bit having a logic high level may be loaded on the bit line BL, and the voltage level of the bit line BL may increase by the second variation voltage ΔV2. At this time, a difference between voltage levels of the bit line BL and the complementary bit line BLB may correspond to a sum ($\Delta V1+\Delta V2$) of the first variation voltage $\Delta V1$ and the second variation voltage $\Delta V2$. At the point in time T34, a voltage difference between the bit line BL and the complementary bit line BLB may be sensed and amplified so that the first supply voltage RTO is generated by coupling the output node thereof to the voltage source supplying the core voltage VCORE and the second supply voltage SB is generated by coupling the output node thereof to the voltage source supplying the ground voltage VSS.

If a data bit having a logic low level (DATA="L") is stored in the memory cell 42, the charge sharing may occur between the cell capacitor C1 and the bit line BL during the third time period between the point in time T33 and the point in time T34 in response to a voltage of the word line SWL which is enabled at the point in time T33. If the charge sharing occurs, the data bit having a logic low level may be loaded on the bit line BL, and the voltage level of the bit line BL may decrease by the second variation voltage $\Delta V2$. At this time, a difference between voltage levels of the bit line BL and the complementary bit line BLB may correspond to a voltage ($\Delta V2-\Delta V1$) that remains after subtracting the first variation voltage $\Delta V1$ from the second variation voltage $\Delta V2$. At the point in time T34, the first supply voltage RTO is generated by coupling the output node thereof to the voltage source supplying the core voltage VCORE and the second supply voltage SB is generated by coupling the output node thereof to the voltage source supplying the ground voltage VSS, and a voltage difference between the bit line BL and the complementary bit line BLB may be sensed and amplified.

As described above, a level of the bit line BL may be adjusted by the second variation voltage $\Delta V2$ due to the charge sharing in a situation where a current flowing through the first PMOS transistor P41 is equal to a current flowing through the second PMOS transistor P42. Thus, even if the threshold voltage of the second PMOS transistor P42 is lower than that of the first PMOS transistor P41, a voltage difference between the bit line BL and the complementary bit line BLB may be sensed and amplified without error.

At least one of the semiconductor devices or at least one of the semiconductor systems described with reference to FIGS. 1 to 12 may be applied to an electronic system that includes a memory system, a graphic system, a computing system, a mobile system, or the like. For example, an electronic system 1000 according an embodiment may include a data storage unit 1001, a memory controller 1002, a buffer memory 1003, and an input/output (I/O) interface 1004.

The data storage unit 1001 may store data outputted from the memory controller 1002 or may read and output the stored data to the memory controller 1002 according to a control signal generated from the memory controller 1002. The data storage unit 1001 may include the second semiconductor device 12 illustrated in FIG. 1. The data storage unit 1001 may include a nonvolatile memory that can retain stored data even in the absence of power supplies. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

Figure 13:
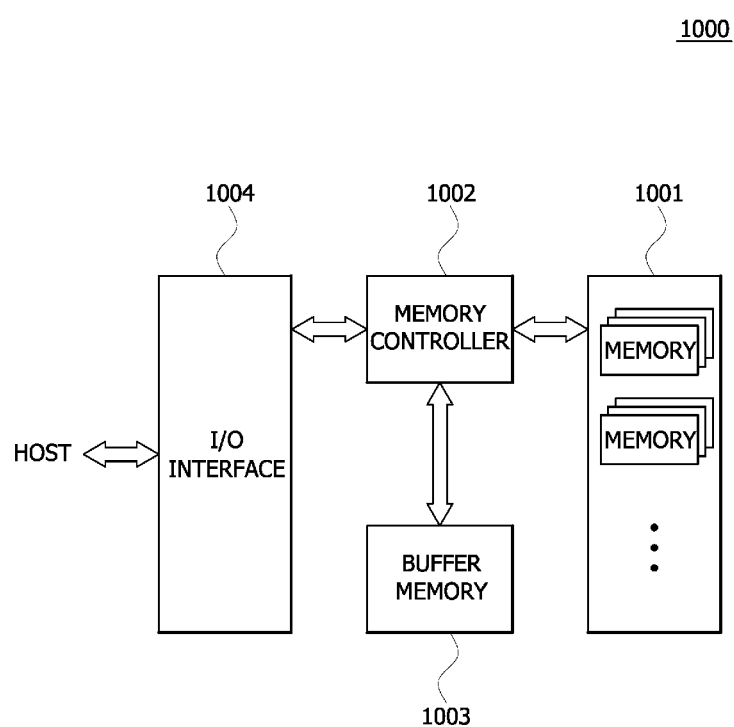
FIG. 13 illustrates a configuration of an electronic system employing the semiconductor device or the semiconductor system illustrated in FIG. 1 to FIG. 12.

The memory controller 1002 may receive a command outputted from an external device (e.g., a host device HOST) through the I/O interface 1004 and may decode the command outputted from the host device to control an operation for inputting data into the data storage unit 1001 or the buffer memory 1003 or for outputting the data stored in the data storage unit 1001 or the buffer memory 1003. The memory controller 1002 may include the first semiconductor device 11 illustrated in FIG. 1. Although FIG. 13 illustrates the memory controller 1002 with a single block, the memory controller 1002 may include two separate controllers, one for controlling the data storage unit 1001 including a nonvolatile memory and one for controlling the buffer memory 1003 including a volatile memory.

The buffer memory 1003 may temporarily store the data processed by the memory controller 1002. That is, the buffer memory 1003 may temporarily store the data which are being outputted from or being inputted to the data storage unit 1001. The buffer memory 1003 may store the data outputted from the memory controller 1002 according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device. Thus, the memory controller 1002 may receive control signals and data supplied from the external device through the I/O interface 1004 and may output the data generated from the memory controller 1002 to the external device through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to various embodiments, by providing one or more additional voltage sources that may compensate for a threshold voltage difference between MOS transistors each coupled to the bit line BL or the complementary bit line BLB, it is possible to prevent a semiconductor device from malfunctioning due to a characteristic difference between the MOS transistors included in the bit line sense amplifier.

What is claimed is:
1. A semiconductor system comprising:
a first semiconductor device suitable for outputting an external command; and
a second semiconductor device suitable for providing a first supply voltage to a bit line sense amplifier, the first supply voltage being generated by using a precharge voltage in response to the external command during a first time period from a point in time when a precharge mode begins, a voltage level of the first supply voltage being adjusted during a second time period from a point in time when the first time period terminates, wherein a voltage level of the first supply voltage is adjusted during the second time period to adjust a voltage level of a bit line or a voltage level of a complementary bit line,
wherein the second time period is terminated to a point of time when a word line is enabled, and
wherein the word line is enabled when an active mode begins.

2. The system of claim 1, wherein the second semiconductor device includes a command decoder suitable for decoding the external command to generate a precharge signal which is enabled in the precharge mode or an active signal which is enabled in the active mode.

3. The system of claim 1, wherein the second semiconductor device includes:
a pre-pull-down control signal generation unit suitable for generating a first pre-pull-down control signal which is enabled during the first time period and a second pre-pull-down control signal which is enabled during the second time period; and
a first supply voltage drive unit suitable for generating the first supply voltage by coupling an output node thereof to a voltage source supplying the precharge voltage in response to the first pre-pull-down control signal and suitable for generating the first supply voltage by coupling an output node thereof to a voltage source supplying a first set voltage in response to the second pre-pull-down control signal.

4. The system of claim 3, wherein the first set voltage is higher than the precharge voltage by a variation voltage.

5. The system of claim 4, wherein the variation voltage is a difference between threshold voltages of MOS transistors included in the bit line sense amplifier.

6. The system of claim 3, wherein the pre-pull-down control signal generation unit further generates, in the second time period, a third pre-pull-down control signal which is enabled from a point in time when the second pre-pull-down control signal is disabled to a point in time when the second time period is terminated.

7. The system of claim 6, wherein the first supply voltage drive unit generates the first supply voltage by coupling an output node thereof to a voltage source supplying a second set voltage in response to the third pre-pull-down control signal.

8. The system of claim 7, wherein:
the second set voltage is higher than the precharge voltage by a variation voltage; and
the first set voltage is an intermediate voltage between the precharge voltage and the second set voltage.

9. The system of claim 8, wherein the variation voltage is a difference between threshold voltages of MOS transistors included in the bit line sense amplifier.

10. The system of claim 3, wherein the second semiconductor device further includes:
a pre-pull-up control signal generation unit suitable for generating a pre-pull-up control signal which is enabled during the first time period; and
a second supply voltage drive unit suitable for generating a second supply voltage by coupling an output node thereof to a voltage source supplying the precharge voltage in response to the pre-pull-up control signal and suitable for stopping generating the second supply voltage during the second time period.

11. The system of claim 10, wherein, in the active mode, the bit line sense amplifier receives the first supply voltage pulled to a ground voltage and the second supply voltage pulled to a core voltage to sense and amplify a voltage difference between a bit line and a complementary bit line.

12. The system of claim 1, wherein the second semiconductor device includes a sense amplifier circuit, and wherein the sense amplifier circuit includes the bit line sense amplifier and is suitable for precharging the bit line and the complementary bit line which are coupled to the bit line sense amplifier with the precharge voltage during the first time period and for receiving the first supply voltage, a voltage level of the first supply voltage being adjusted during the second time period to adjust a voltage level of the bit line or a voltage level of the complementary bit line according to a threshold voltage difference between MOS transistors included in the bit line sense amplifier.

13. A semiconductor device comprising:
a pre-pull-down control signal generation unit suitable for generating a first pre-pull-down control signal which is enabled during a first time period from a point in time when a precharge signal is enabled and suitable for generating a second pre-pull-down control signal which is enabled during a second time period from a point in time when the first time period is terminated; and
a first supply voltage drive unit suitable for generating a first supply voltage by coupling an output node thereof to a voltage source supplying the precharge voltage in response to the first pre-pull-down control signal and suitable for generating the first supply voltage by coupling an output node thereof to a voltage source supplying a first set voltage in response to the second pre-pull-down control signal,
wherein the first supply voltage is supplied to a bit line sense amplifier,
wherein the first supply voltage is pulled to the set voltage during the second time period to adjust a voltage level of a bit line or a voltage level of a complementary bit line,
wherein the second time period is terminated to a point of time when a word line is enabled and
wherein the word line is enabled when an active signal is enabled.

14. The device of claim 13, wherein the precharge signal is enabled in a precharge mode, and the active signal is enabled in an active mode.

15. The device of claim 13, wherein the set voltage is higher than the precharge voltage by a variation voltage.

16. The device of claim 15, wherein the variation voltage is a difference between threshold voltages of MOS transistors included in the bit line sense amplifier.

17. The device of claim 13, wherein the first supply voltage drive unit generates the first supply voltage by coupling an output node thereof to a voltage source supplying a second set voltage in response to a third pre-pull-down control signal.

18. The device of claim 17, wherein:
the second set voltage is higher than the precharge voltage by a variation voltage; and
the first set voltage has an intermediate level between the precharge voltage and the second set voltage.

19. The device of claim 18, wherein the variation voltage is a difference between threshold voltages of MOS transistors included in the bit line sense amplifier.

20. The device of claim 13, further comprising:
a sense amplifier circuit including the bit line sense amplifier,
wherein the sense amplifier circuit is suitable for precharging the bit line and the complementary bit line which are coupled to the bit line sense amplifier with the precharge voltage during the first time period and is suitable for receiving the first supply voltage pulled to the set voltage during the second time period to adjust a voltage level of the bit line or a voltage level of the complementary bit line according to a threshold voltage difference between MOS transistors included in the bit line sense amplifier.

* * * * *